(12) United States Patent
Shaheen

(10) Patent No.: US 7,723,749 B2
(45) Date of Patent: May 25, 2010

(54) STRAINED SEMICONDUCTOR STRUCTURES

(75) Inventor: Mohamad A. Shaheen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 349 days.

(21) Appl. No.: 11/521,618

(22) Filed: Sep. 13, 2006

(65) Prior Publication Data

US 2007/0007509 A1    Jan. 11, 2007

Related U.S. Application Data

(62) Division of application No. 10/669,063, filed on Sep. 23, 2003, now Pat. No. 7,157,379.

(51) Int. Cl.
*H01L 31/0328* (2006.01)

(52) U.S. Cl. .................. 257/190; 257/191; 257/192; 257/193; 257/194; 257/195; 257/196; 257/616; 257/E29.085

(58) Field of Classification Search .............. 438/285; 257/190–196, E29.085, 616

See application file for complete search history.

(56) References Cited

U.S. PATENT DOCUMENTS 6,107,653 A    8/2000    Fitzgerald

2002/0197803 A1    12/2002    Leitz et al.
2004/0067644 A1    4/2004    Malik et al.
2004/0075105 A1*    4/2004    Leitz et al. .................. 257/190

FOREIGN PATENT DOCUMENTS

EP    1085562    3/2001
WO    WO 01/54202    7/2001

OTHER PUBLICATIONS

Notification of transmittal of the international search report and the written opinion of the international search suthority, or the declaration, PCT/US2004/030504, Apr. 1, 2005.

* cited by examiner

*Primary Examiner*—Zandra Smith
*Assistant Examiner*—Minchul Yang
(74) *Attorney, Agent, or Firm*—Blakely, Sokoloff, Taylor & Zafman LLP

(57) ABSTRACT

A method for in situ formation of low defect, strained silicon and a device formed according to the method are disclosed. In one embodiment, a silicon germanium layer is formed on a substrate, and a portion of the silicon germanium layer is removed to expose a surface that is smoothed with a smoothing agent. A layer of strained silicon is formed on the silicon germanium layer. In various embodiments, the entire method is conducted in a single processing chamber, which is kept under vacuum.

21 Claims, 3 Drawing Sheets

STRAINED SEMICONDUCTOR STRUCTURES

RELATED APPLICATION

The application is a divisional of U.S. patent application Ser. No. 10/669,063, filed Sep. 23, 2003 issued as U.S. Pat. No. 7,157,379 on Jan. 2, 2007.

FIELD

The embodiments disclosed herein relate generally to circuit processing.

BACKGROUND

The performance levels of various semiconductor devices, such as transistors, are at least partly dependent on the mobility of charge carriers (e.g., electrons and/or electron vacancies, which are also referred to as holes) through the semiconductor device. In a transistor, the mobility of the charge carriers through the channel region is particularly important.

The mobility of charge carriers can be affected by various factors. For example, a rough surface of a particular layer of a device may decrease charge carrier mobility through that layer of the device. Dislocations of charge carriers may also reduce charge carrier mobility by creating a local scatter area for the charge carriers, which can act as a leakage path that causes power loss through that section of the device.

The problems associated with dislocations are not isolated to a single layer of the device. Specifically, dislocations on an existing device layer can propagate through additional layers that are formed on the existing layer. Thus, the dislocations exhibited by one layer can subsequently migrate and inhibit charge carrier mobility throughout one or more layers of the final device.

Various techniques have been used to improve charge carrier mobility in semiconductor devices. For example, the epitaxial growth process typically used to form layers of a device can be significantly slowed down to reduce the number of defects (e.g., dislocations) in the final device. However, devices constructed according to this technique still generally have dislocations on the order of approximately 100,000 per square centimeter.

Alternatively, a chemical-mechanical polish ("CMP") can be used to reduce the thickness of a layer of a device and simultaneously smooth the surface of the reduced layer, which can enhance charge carrier mobility. However, the CMP process is relatively costly and complex due to the fact that the CMP process requires at least two additional modules besides the epitaxial growth module (e.g., the CMP module and a cleaning module to clean the device layer after the CMP procedure). From an infrastructure standpoint, the additional modules for the CMP process require generally costly items such as a slurry supply, waste disposal, and additional space.

Moreover, the CMP process requires moving the device layer between modules, which exposes the device layer to atmospheric contaminants and native oxides, both of which can result in impurities that can cause an increase in defects on the device layer. Device layers constructed according to the CMP technique generally have dislocations on the order of approximately 10,000 per square centimeter.

DESCRIPTION OF THE DRAWINGS

Various embodiments are illustrated by way of example and not by way of limitation in the figures of the accompanying drawings in which like references indicate similar elements. It should be noted that references to "an," "one," "the," "other," "alternative," or "various" embodiments in this disclosure are not necessarily to the same embodiment, and such references mean at least one.

DETAILED DESCRIPTION

The following description and the accompanying drawings provide examples for the purposes of illustration. However, these examples should not be construed in a limiting sense as they are not intended to provide an exhaustive list of all possible implementations.

Figure 1:
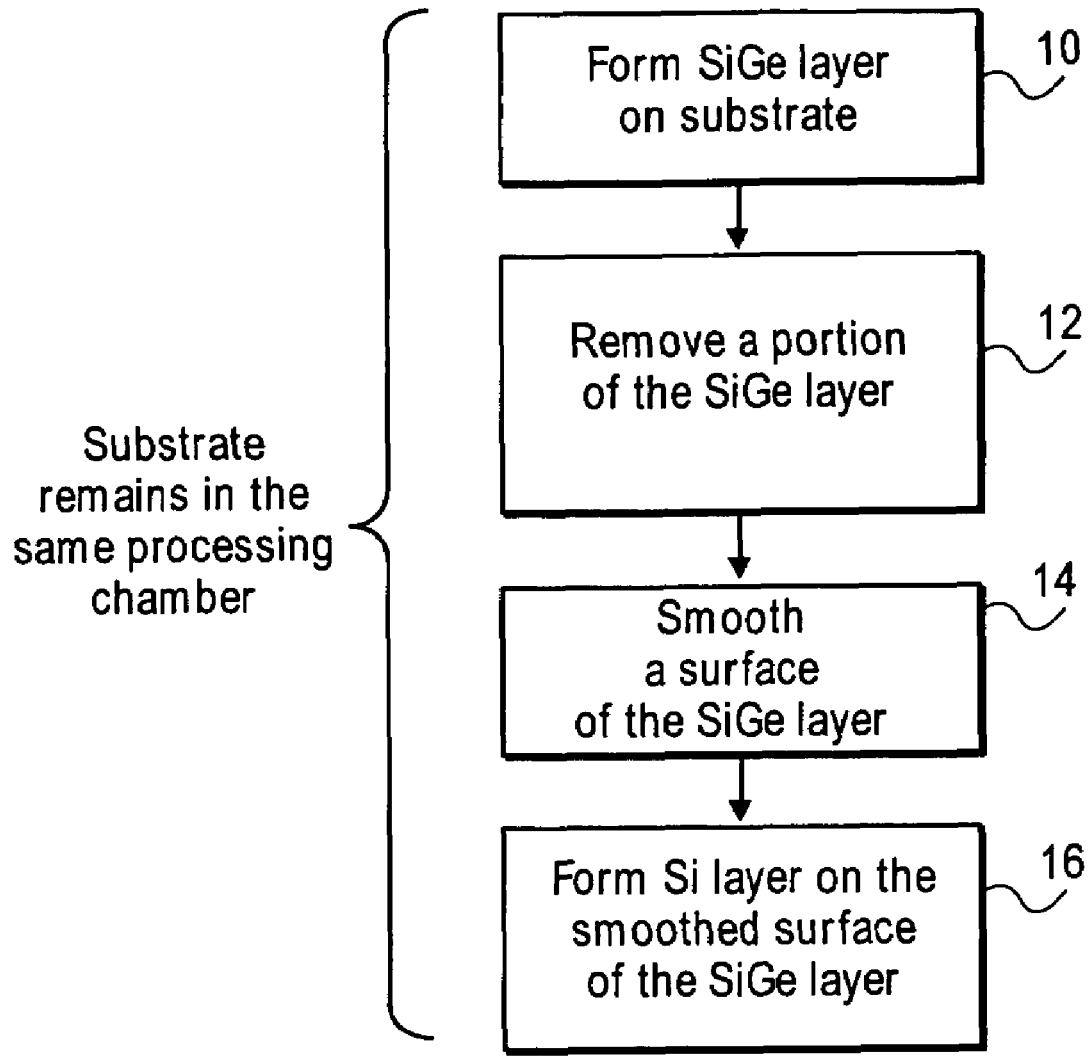
FIG. 1 is a flow chart showing one embodiment of a method for in situ formation of low defect, strained silicon.

Referring now to FIG. 1, a flow chart is shown for one embodiment of a method for in situ formation of low defect, strained silicon. At block 10, a silicon germanium layer is formed on a substrate in a processing chamber. In various embodiments, the substrate is comprised of silicon. The processing chamber can be, for example, a chemical vapor deposition ("CVD") chamber, a metalorganic CVD ("MOCVD") chamber, or a plasma-enhanced CVD ("PECVD") chamber.

In one embodiment, the silicon germanium layer may be comprised of a graded silicon germanium layer formed on the substrate and a relaxed silicon germanium layer formed on the graded silicon germanium layer. For example, the graded silicon germanium layer can have a concentration of germanium that increases throughout the thickness of the graded silicon germanium layer. In various embodiments, the concentration of germanium throughout the graded silicon germanium layer can be between approximately 0 percent and 30 percent. However, other concentrations beyond this range can be used.

For a p-type metal oxide semiconductor device ("PMOS"), in one embodiment, the concentration of germanium in an upper portion of the graded silicon germanium layer is between approximately 25 percent and 30 percent. For an n-type metal oxide semiconductor device ("NMOS"), in one embodiment, the concentration of germanium in an upper portion of the graded silicon germanium layer is between approximately 20 percent and 25 percent. However, a concentration of 30 percent germanium in the upper portion of the graded silicon germanium layer can work well for both PMOS and NMOS devices. Although the preferred concentrations of germanium for PMOS devices and NMOS devices are set forth above, other concentrations may be used.

In one embodiment, the concentration of germanium in the graded silicon germanium layer can be increased by 10 percent for every micron of thickness of the graded silicon germanium layer. For example, a graded silicon germanium layer with a thickness of 3 microns could be grown over a period of 8-12 hours and have an increasing concentration of germanium from 0 percent at the bottom portion of the layer to 30 percent at the upper portion of the layer. In various embodiments, the chemistry used to form the silicon germanium layer (e.g., that may have a graded layer and a relaxed layer) can include one or more of silane (e.g., $SiH_4$), germane (e.g., $GeH_4$), and dichlorosilane (e.g., $Cl_2Si_4$), depending on the desired germanium content. The concentration of each of the particular constituents (e.g., silane, germane, dichlorosilane) may be varied during introduction into a processing chamber (e.g, a chemical vapor deposition ("CVD") chamber) to achieve the graded effect.

The relaxed silicon germanium layer can have a constant concentration of germanium that is approximately the same as that of an upper portion of the graded silicon germanium layer. Moreover, the relaxed silicon germanium layer can be formed to a thickness between approximately 0.5 and 1 micron.

At block 12 of FIG. 1, a portion of the silicon germanium layer is removed in the processing chamber to remove the upper surface of the silicon germanium layer that may have a higher number of dislocations than a lower portion of the silicon germanium layer. In various embodiments, between approximately 0.1 and 0.2 microns of the silicon germanium layer is removed. The removal of a portion of the silicon germanium layer may include introduction of an etchant to a surface of the silicon germanium layer. The etchant may be, for example, at least one of HCl and HBr.

In an embodiment in which the silicon germanium layer comprises a graded silicon germanium layer and a relaxed silicon germanium layer, the etchant can be introduced before and/or after formation of the relaxed silicon germanium layer. If applied to a surface of the relaxed silicon germanium layer, the etchant can advantageously remove any cross-hatched surface roughness of the relaxed silicon germanium layer that is caused by dislocations in the graded silicon germanium layer that have propagated up to the surface of the relaxed silicon germanium layer.

The surface of the silicon germanium layer (e.g., that is exposed by the removal at block 12) can be smoothed in the processing chamber at block 14. Although shown as two distinct blocks, the removal at block 12 and smoothing at block 14 can be conducted simultaneously or sequentially. By smoothing the exposed surface, dislocations are removed and/or minimized to prevent propagation of dislocations from the silicon germanium layer up to the silicon layer formed at block 16.

In various embodiments, smoothing comprises introducing a smoothing agent (e.g., hydrogen) to the surface of the silicon germanium layer. Like the etchant, the smoothing agent may be introduced before and/or after formation of the relaxed silicon germanium layer. Introduction of a smoothing agent such as hydrogen may be conducted at a temperature of approximately 1100° Celsius (e.g., a high temperature anneal).

At block 16, a silicon layer is formed on the smoothed surface of the silicon germanium layer. The chemistry used to form the silicon layer may include silane. In various embodiments, the silicon layer may be formed to a thickness between approximately 50 Å and 1000 Å. The silicon layer formed at block 16 can have a relatively smooth surface and a low level of defects (e.g., less than approximately 10,000 dislocations per square centimeter, preferably less than approximately 1,000 dislocations per square centimeter) since many of the defects in the silicon germanium layer were etched away and the top surface of the silicon germanium layer smoothed to prevent propagation of defects up to the silicon layer.

Formation of a silicon layer on a silicon germanium layer results in a strained silicon layer due to the mismatch in lattice size between silicon and silicon germanium (e.g., which has a larger lattice due to the germanium content). Thus, the silicon layer expands (e.g., becomes strained) in order to match up with the silicon germanium lattice. The strained silicon advantageously improves charge carrier mobility through the device. Among other advantages, reduction of defects and/or dislocations during processing helps to maximize the benefits of strained silicon.

As indicated in FIG. 1, the substrate remains in the same processing chamber from block 10 through block 16. Moreover, in various embodiments, the processing chamber can be kept under vacuum from a time at least as early as during removal of a portion of the silicon germanium layer (e.g., block 12) until after completion of formation of the silicon layer (e.g., block 16).

One advantage of not removing the substrate from the processing chamber until after the silicon layer is formed is that the introduction of atmospheric contaminants onto the substrate during processing can be minimized, if not eliminated, which decreases the number of defects on the substrate. This advantage is further realized by maintaining the processing chamber under vacuum during processing, which limits the level of impurities (e.g., atmospheric contaminants and native oxides) that can be deposited on the substrate.

Figure 2:
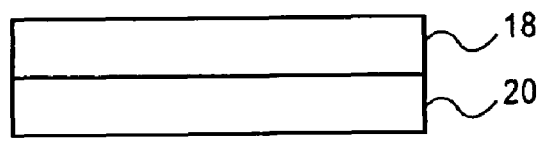
FIG. 2 shows the formation of a graded silicon germanium layer on a substrate, according to one embodiment.

FIGS. 2 through 5 show the sequence for in situ formation of low defect, strained silicon, according to one embodiment. Specifically, FIG. 2 shows substrate 20 with graded silicon germanium layer 18 formed on substrate 20. As described above, graded silicon germanium layer 18 can have an increasing concentration of germanium throughout its thickness. In various embodiments, the concentration of germanium increases by 10% for every micron of thickness of graded silicon germanium layer 18.

Figure 3:
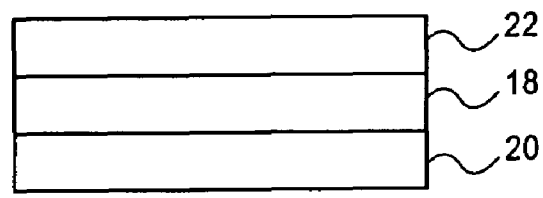
FIG. 3 shows the formation of a relaxed silicon germanium layer on the graded silicon germanium layer of FIG. 2.

FIG. 3 shows relaxed silicon germanium layer 22 formed on graded silicon germanium layer 18 of FIG. 2. In various embodiments, relaxed silicon germanium layer 22 has a constant concentration of germanium throughout its thickness, which may be approximately the same concentration as that of an upper portion of graded silicon germanium layer 18. Moreover, in one embodiment, relaxed silicon germanium layer 22 may have a thickness between approximately 0.5 and 1 micron.

Figure 4:
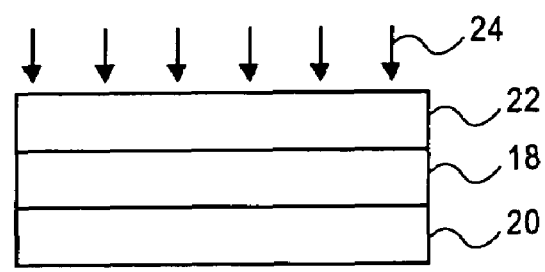
FIG. 4 shows the introduction of an etchant and a smoothing agent onto a surface of the relaxed silicon germanium layer of FIG. 3.
Figure 5:
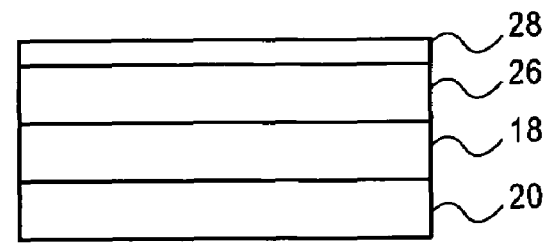
FIG. 5 shows the formation of a silicon layer on the smoothed surface of a reduced relaxed silicon germanium layer.

FIG. 4 shows an etchant and a smoothing agent being introduced onto a surface of relaxed silicon germanium layer 22 as mixture 24. As described above, the etchant and smoothing agent can be introduced separately or concurrently in order to remove a portion of relaxed silicon germanium layer 22 and to smooth a surface of relaxed silicon germanium layer 22 that is exposed by removal of a portion of relaxed silicon germanium layer 22. The result of the introduction of mixture 24 is reduced (e.g., thickness) relaxed silicon germanium layer 26, shown in FIG. 5. FIG. 5 shows silicon layer 28 formed on reduced relaxed silicon germanium layer 26. In various embodiments, silicon layer 28 may have a thickness between approximately 50 Å and 1000 Å.

Silicon layer 28 has, in various embodiments, a defect density of less than approximately 10,000 dislocations per square centimeter and, more preferably, less than approximately 1,000 dislocations per square centimeter. If the device of FIG. 5 is constructed according to the teachings of the various embodiments disclosed herein, the interface between the silicon germanium layer and the silicon layer will have good edge uniformity and will not have etching residues disposed along the interface. These two characteristics of the interface are distinct from devices constructed using a CMP process, which will leave etching residues and a non-uniform interface due to the nature of the CMP process. Moreover, the device of FIG. 5 will not have atmospheric contaminants along the interface between the silicon germanium layer and the silicon layer due to the fact that the device is formed in a single processing chamber.

Figure 6:
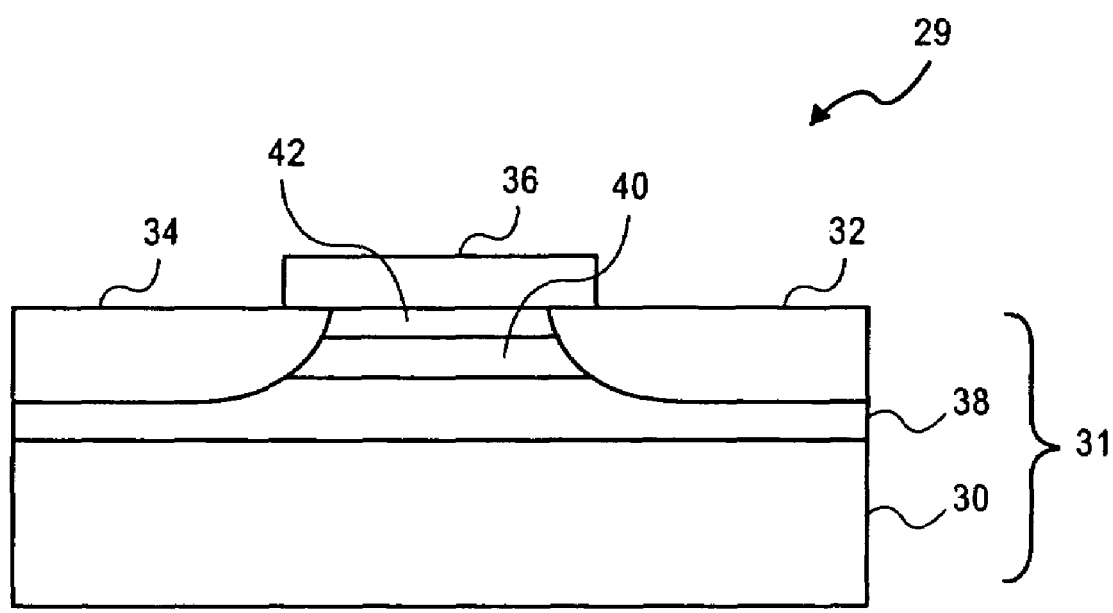
FIG. 6 is one embodiment of a device constructed according to the methods described herein.

The various methods described herein can be used to form, for example, device 29 of FIG. 6. Device 29 includes composite substrate 31 with first source/drain region 32 and second source/drain region 34 formed therein. Gate electrode 36 is formed on a surface of composite substrate 31. Composite substrate 31 also includes, in this embodiment, base substrate 30 of silicon.

The channel region of device 29 (e.g., below gate electrode 36, as shown in FIG. 6) includes graded silicon germanium layer 38, relaxed silicon germanium layer 40, and silicon layer 42. In other embodiments, a single silicon germanium layer (e.g., that may have either a graded or a constant concentration of germanium) may be used in place of graded silicon germanium layer 38 and relaxed silicon germanium layer 40 in combination.

Graded silicon germanium layer 38 is disposed on substrate 30. As described above, in one embodiment, graded silicon germanium layer 38 has an increasing concentration of germanium throughout its thickness. For example, graded silicon germanium layer 38 may have a concentration of germanium that increases by 10 percent for every micron of thickness of graded silicon germanium layer 38.

Relaxed silicon germanium layer 40 is disposed on graded silicon germanium layer 38 and has a constant concentration of germanium throughout its thickness. In one embodiment, relaxed silicon germanium layer 40 has approximately the same concentration of germanium as the concentration of germanium in an upper portion of graded silicon germanium layer 38. In various embodiments, relaxed silicon germanium layer 40 may have a thickness of between approximately 0.5 and 1.0 micron.

Silicon layer 42 is disposed on relaxed silicon germanium layer 40. In various embodiments silicon layer 42 can have a thickness between approximately 50 Å and 1000 Å. Due to the difference in lattice size of relaxed silicon germanium layer 40 and silicon layer 42, silicon layer 42 is strained, which enhances charge carrier mobility through the channel region of device 29. Device 29, with its enhanced charge carrier mobility, can be advantageously used, for example, as a transistor in any suitable circuit.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claims.

I claim:

1. An apparatus comprising:
   a substrate;
   a silicon germanium layer formed on the substrate; and
   a silicon layer formed on the silicon germanium layer, wherein the silicon layer has a defect density of less than approximately 10,000 dislocations per square centimeter.

2. The apparatus of claim 1, wherein the silicon germanium layer comprises:
   a first layer of silicon germanium formed on the substrate, wherein the first layer has an increasing concentration of germanium throughout a thickness of the first layer; and
   a second layer of silicon germanium formed on the first layer of silicon germanium, wherein the second layer has a constant concentration of germanium throughout a thickness of the second layer.

3. The apparatus of claim 2, wherein the concentration of germanium in the first layer increases by 10% for every micron of thickness of the first layer.

4. The apparatus of claim 2, wherein the thickness of the second layer is between approximately 0.5 and 1 micron.

5. The apparatus of claim 2, wherein the second layer comprises:
   approximately the same concentration of germanium in the second layer as the concentration of germanium in an upper portion of the first layer.

6. The apparatus of claim 1, wherein the silicon layer has a thickness between approximately 50 Å and 1000 Å.

7. The apparatus of claim 1, wherein the silicon layer has a defect density of less than approximately 1,000 dislocations per square centimeter.

8. An apparatus comprising:
   a substrate;
   a silicon germanium layer formed on the substrate; and
   a silicon layer formed on the silicon germanium layer, wherein the silicon germanium layer comprises a relaxed silicon germanium layer, wherein the silicon layer directly contacts the relaxed silicon germanium layer, and wherein the silicon layer forms an interface between the relaxed silicon germanium layer and the silicon layer, wherein the silicon layer has a defect density of less than approximately 10,000 dislocations per square centimeter.

9. The apparatus of claim 8, wherein the silicon germanium layer comprises:
   a first layer of silicon germanium formed on the substrate, wherein the first layer has an increasing concentration of germanium throughout a thickness of the first layer; and
   a second layer of silicon germanium formed on the first layer of silicon germanium, wherein the second layer has a constant concentration of germanium throughout a thickness of the second layer.

10. The apparatus of claim 9, wherein the concentration of germanium in the first layer increases by 10% for every micron of thickness of the first layer.

11. The apparatus of claim 9, wherein the thickness of the second layer is between approximately 0.5 and 1 micron.

12. The apparatus of claim 9, wherein the second layer comprises:
   approximately the same concentration of germanium in the second layer as the concentration of germanium in an upper portion of the first layer.

13. The apparatus of claim 8, wherein the silicon layer has a thickness between approximately 50 Å and 1000 Å.

14. The apparatus of claim 8, wherein a lattice spacing of the silicon is mismatched with a lattice spacing of the relaxed silicon germanium.

15. The apparatus of claim 8, wherein the silicon germanium layer comprises a smoothed surface.

16. The apparatus of claim 8 wherein the silicon germanium layer comprises an etched surface.

17. The apparatus of claim 8, wherein the silicon layer is an expansive strained silicon layer.

18. The apparatus of claim 8, wherein the interface does not have etching residues and does not have atmospheric contaminates.

19. The apparatus of claim 8, wherein the silicon layer consists of silicon that is strained due to a lattice size mismatch between the relaxed silicon layer and the silicon germanium layer.

20. The apparatus of claim 8, wherein the silicon layer touches the relaxed silicon germanium layer.

21. The apparatus of claim 20, wherein silicon layer consists of silicon that is strained due to touching and forming an interface with relaxed silicon germanium material of the relaxed silicon germanium layer.

* * * * *